United States Patent
Boyette, Jr. et al.

[11] Patent Number: 6,023,171
[45] Date of Patent: Feb. 8, 2000

[54] DUAL-CONTACT PROBE TIP FOR FLYING PROBE TESTER

[75] Inventors: James Edward Boyette, Jr., Delray Beach; Robert Edward Brown, Boca Raton; Christian J. Bunker, Boynton Beach; James Christopher Mahlbacher, Lake Worth, all of Fla.

[73] Assignee: International Business Machines Corporation, Armonk, N.Y.

[21] Appl. No.: 08/910,428

[22] Filed: Aug. 13, 1997

[51] Int. Cl.$^7$ .................................................. G01R 31/02
[52] U.S. Cl. ................................................ 324/754; 439/482
[58] Field of Search .................................. 324/754, 758, 324/72.5, 762; 439/482

[56] References Cited

U.S. PATENT DOCUMENTS

| | | | |
|---|---|---|---|
| 3,458,687 | 7/1969 | Cranch | 219/521 |
| 3,466,539 | 9/1969 | Pitts et al. | 324/62 |
| 3,611,128 | 10/1971 | Nagata | 324/72.5 |
| 4,045,737 | 8/1977 | Coberly | 324/72.5 |
| 4,308,498 | 12/1981 | Madajewski et al. | 324/64 |
| 4,423,373 | 12/1983 | Lecroy, Jr. | 324/72.5 |
| 4,480,223 | 10/1984 | Aigo | 324/72.5 |
| 4,894,612 | 1/1990 | Drake et al. | 324/72.5 |
| 5,151,653 | 9/1992 | Yutori et al. | 324/72.5 |
| 5,467,020 | 11/1995 | Boyette, Jr. et al. | 324/537 |
| 5,488,314 | 1/1996 | Brandt et al. | 324/758 |
| 5,489,855 | 2/1996 | Poisel | 324/762 |
| 5,543,726 | 8/1996 | Boyette, Jr. et al. | 324/758 |
| 5,764,072 | 7/1998 | Kister | 324/754 |

OTHER PUBLICATIONS

F.L. Graner, et al., *IBM Technical Disclosure Bulletin*, Electrical Probe, vol. 8, No. 12, May, 1966, p. 1722.
M. Schmidt et al., *IBM Technical Disclosure Bulletin*, Multipoint Probe Holder, vol. 12, No. 1. Jun. 1969, p. 181.
J. Arnhart et al., *IBM Technical Disclosure Bulletin*, Miniature Kelvin Probe, vol. 12, No. 12, May, 1977, p. 4679.

*Primary Examiner*—Josie Ballato
*Assistant Examiner*—Minh Tang
*Attorney, Agent, or Firm*—Richard A. Tomlin; Ronald V. Davidge

[57] ABSTRACT

A dual contact probe tip is provided within a flying probe circuit tester to make separate electrical contacts with a circuit under test at two closely-spaced test points. The tip includes a mounting block having an attachment section attached to a carriage of the tester and a pair of flexible cantilever sections, with a probe pin extending from a distal end of each of these cantilever sections to make contact with the circuit. One electrical path is established through the conductive mounting block and one of the probe pins. The other probe pin is coated with an insulating material except for its point and for a surface to which a wire is soldered, so that the other electrical path is established through this other probe pin and the attached wire. Each probe pin is tapered toward its point, and the probe pins extend from the mounting block at an oblique angle toward one another.

17 Claims, 3 Drawing Sheets

DUAL-CONTACT PROBE TIP FOR FLYING PROBE TESTER

BACKGROUND OF THE INVENTION

1. Field of the Invention

This invention relates to probe tips for circuit testing, and, more particularly to a probe tip providing dual contact paths within a flying probe tester.

2. Background Information

Probe configurations for establishing contact with electronic circuits during testing processes are typically formed either as ganged probes or flying probes. With ganged probes, a number, which may be a large number, of probe contacts simultaneously contact the circuit being tested at a corresponding number of different points. Individual tests are performed in a sequential manner by switching these individual probes to test circuits within the testing apparatus. With flying probes, a relatively small number of probes, typically two, are moved among the various circuit points to be connected to the test circuits in a sequential manner. Each of the flying probes contacts a single circuit test point at a time.

A particular form of testing which has found value in a number of applications is known as four-point or Kelvin testing. In this process, testing occurs between two points in a circuit under test, with each of these points being simultaneously contacted by two probe points from a single probe assembly. These two probe points are electrically isolated from one another, with a drive signal being applied to the circuit under test through one of the probe points. A sensing signal is provided to a test circuit within the test apparatus through the other of the probe points. This sensing signal may be provided to high impedance circuits within the test apparatus, so that little current is drawn, minimizing the effect of contact resistance on the measurements being made.

Regardless of the testing method used, electronic circuits are becoming smaller but more complex. For ganged probes, these changes mean that increasing numbers of probes must contact points within a smaller space. The probes must be smaller, closer together, and more accurately spaced, since the circuit pads on which they are placed must be smaller. For flying probes, these changes mean that, since more circuits must be tested, the probes must be moved from one position to another more rapidly to facilitate an efficient testing process. Thus, the flying probe itself must by quite light to allow rapid acceleration. Furthermore, what is needed is a method for making the electrical connections between a flying probe and the circuit points more reliable and repeatable.

What is needed is a miniature probe facilitating the application of the Kelvin testing process within a high-speed flying-probe circuit tester.

DESCRIPTION OF THE PRIOR ART

Several U.S. Patents describe apparatus providing a number of probe contacts arranged in a linear, close-spaced configuration for ganged probe applications. For example, U.S. Pat. No. 4,045,737 describes a plastic substrate carrying a number of thin conductive elements, generally at right angles to the major surface of the substrate. Each conductive element, which includes a contact point for contacting a circuit test point, which is beyond the edge of the substrate, is made flexible through the use of a pair of cantilever sections. U.S. Pat. No. 5,151,653 describes an inspection probe including a number of fine wires, each of which extends partly as a flexible probe and partly within an encapsulating resin base. U.S. Pat. No. 5,488,314 describes a buckling beam test probe assembly with contact probes made of a composite material and a stripper plate constructed to allow scrubbing and controllable wiping of the contact probe on the surface of the device to be tested. U.S. Pat. No. 4,894,612 describes a ganged probe providing a number of connections having high bandwidth transmission capabilities to a circuit on a wafer.

U.S. Pat. No. 3,466,539 describes a probe assembly designed to place four closely-spaced but separated probe points in contact with a conductive coating to test its conductivity. Coil springs are used to provide forces loading the individual probe points in this relatively large apparatus, which is to be positioned by hand, with the help of a fixture.

Other U.S. Patents describe probes used in the four-point or Kelvin test process. U.S. Pat. No. 4,423,373 describes a test probe having only two substantially rigid, electrically conducting members terminating in contact portions, which are electrically insulated from one another, and which are mounted within an insulated handle. Two such probes are used to contact different portions of a circuit trace in the measurement of a current flow through the trace. U.S. Pat. No. 4,308,498 describes a test fixture having two contacts for electrically contacting each side of a two-terminal leadless component to be tested. The component is inserted within the fixture in a manner creating wiping between the contacts and the component.

A number of other U.S. Patents describe flying-probe test apparatus using individual probes, instead of the dual probe assemblies needed for Kelvin testing. For example, U.S. Pat. No. 5,543,726 describes a system for probing both sides of a high-density printed circuit board. Two independently-positionable probes are provided on each side of the printed circuit board, so that tests may be applied to circuits on either side and to circuits extending through the board. U.S. Pat. No. 5,467,020 describes a mechanism for testing circuit traces extending along each side of a flexible substrate and to circuit traces extending between these sides. The mechanism includes upper and lower plates, each of which is slotted for probe access. Opposite each slot, a strip portion of the other plate supports the flexible circuit.

In the *IBM Technical Disclosure Bulletin,* Vol. 19, No. 12, May, 1977, pp. 4679–4680, a miniature probe including two separate buckling beams, each of which has a half-round cross section. The beams are confined within a channel which confines them while providing free upward and downward axial movement, so that the beams, moving independently, can contact an uneven surface. Because of the length required to accommodate the buckling beam springs, this device cannot readily be used in a high-speed, flying-probe test fixture.

What is needed is a miniature, light-weight, dual-contact probe tip for use in a flying-probe test fixture. The probes should have some individual resilience so that they can be used on an uneven surface on the circuit under test.

SUMMARY OF THE INVENTION

A first objective of the present invention is to establish a probe tip making separate electrical connections to closely spaced points on a circuit under test.

Another objective is to provide a dual-contact probe tip which is both small and light for use in the rapidly accelerating carriage of a flying probe tester.

Another objective is to provide a dual contact probe tip having probe pins which are individually resiliently mounted to make proper contact with an uneven circuit surface.

In accordance with one aspect of the invention, there is provided a dual contact probe tip for applying an input signal to a first circuit test point and for measuring a resulting signal at a second circuit test point in close proximity with the first circuit test point. The dual-contact probe tip includes a mounting block, first and second probe pins, and a mounting mechanism. The mounting block has an attachment section and a pair of flexible sections, each of which extends from the attachment section to a distal end of the flexible section. Each probe pin descends from a distal end of a flexible section to a probe point, with the two probe points lying in close proximity. The mounting mechanism attaches the attachment section to a carriage within a circuit tester.

DETAILED DESCRIPTION

Figure 1:
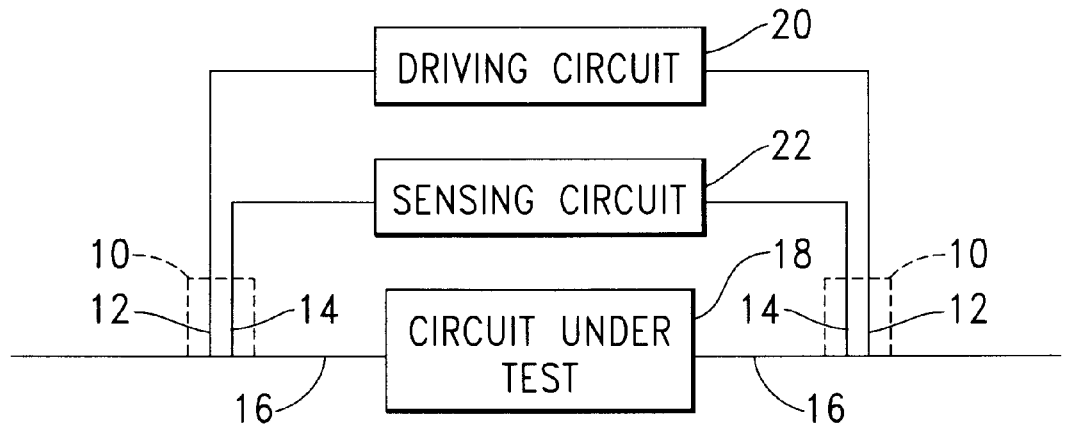
FIG. 1 is a schematic diagram showing the apparatus of a Kelvin test process, to which probe tips built in accordance with the present invention may be applied.

FIG. 1 is a schematic diagram showing apparatus to apply a Kelvin test process. Each probe tip 10 includes a pair of probe contacts 12, 14, which contact a lead 16 extending from a circuit under test 18. A driving circuit 20 applies a driving voltage function between the two probe contacts 12, while a sensing circuit 22 measures the resulting voltage between the two probe contacts 14. Since the sensing circuit 22 is a high impedance device, the current required to drive the circuit under test 18 is generally much higher than the current required to measure the across the sensing circuit 22. The actual driving function applied to the circuit under test 18 is diminished from the level provided as an output by the driving circuit 20 due to contact resistance between probes 12 and the leads 16. However, the sensing circuit 22 is used to determine the voltage function applied to the circuit under test 18 during the test and hence to determine if the circuit under test 18 meets pass/fail criteria previously established for the test. Alternately, the sensing circuit 22 may be used to correct and control operation of the driving circuit 20, so that a predetermined voltage function is applied to the circuit under test 18, in spite of variations in the contact resistance between the probes 12 and the circuit leads 16.

While the voltage level measured by sensing circuit 22 is diminished by losses occurring due to contact resistance between the probes 14 and the leads 16, such losses are much less than those occurring due to contact resistance between the probes 12 and the lead 16, so that the signal measured by the sensing circuit 22 is much closer to the actual signal placed across the circuit under test 18. This advantage is achieved by using high impedance circuits within the sensing circuit 22, so that the current flowing through the probe contacts 14 is much less than the current flowing simultaneously through the driving circuit 20. In this way, the effect of probe to lead contact resistance is nearly eliminated as a cause of testing error.

Figures 2, 4:
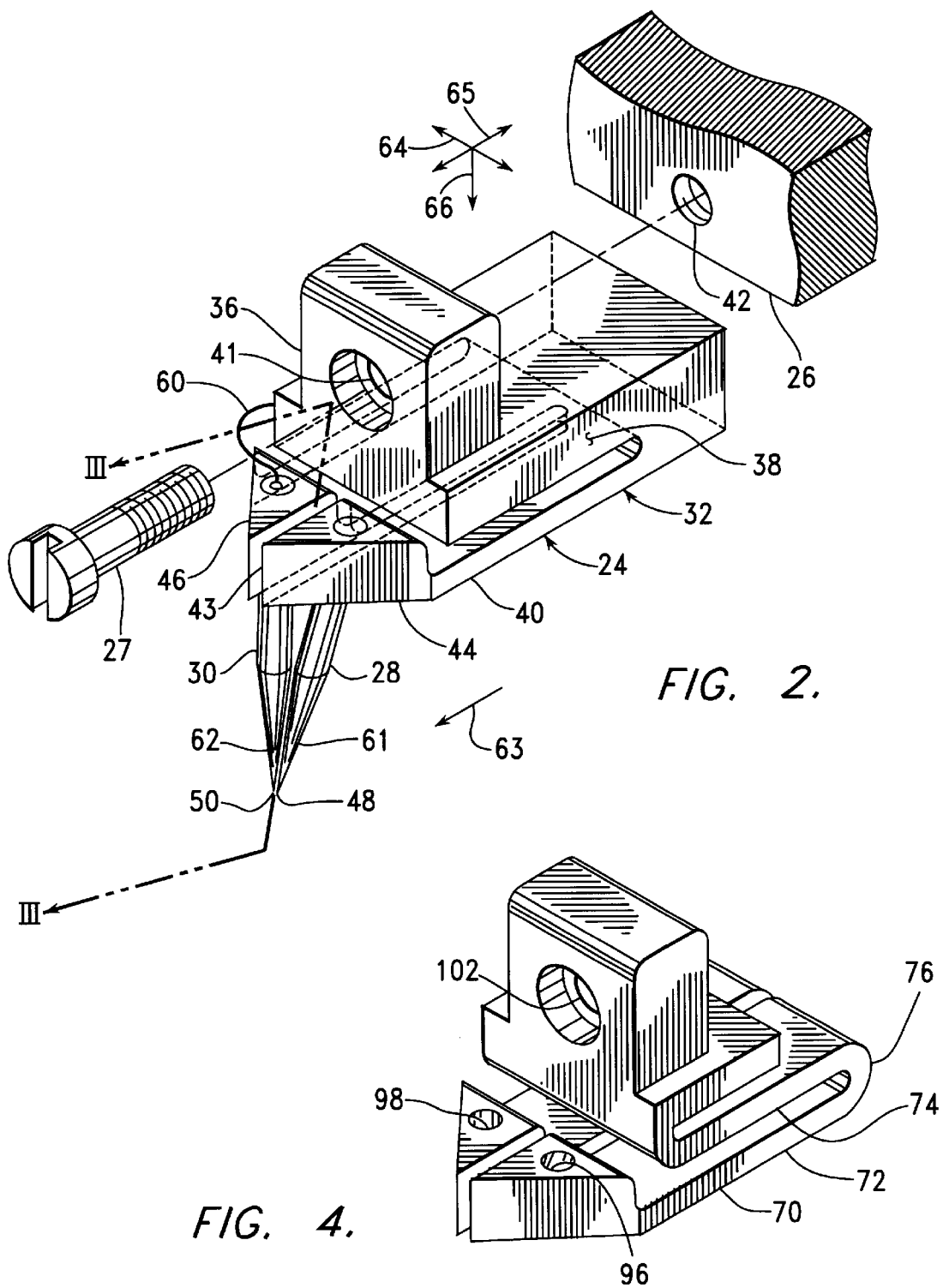
FIG. 2 is an isometric view of a dual-contact probe tip built in accordance with the present invention, in an exploded relationship with a mounting screw and a moving carriage.
FIG. 4 is an isometric view of a first probe pin mounting block which can be used as an alternative to the probe pin mounting block of FIG. 2.

FIG. 2 is an isometric view of a dual-contact probe tip 24 built in accordance with the present invention, in an exploded relationship with a carriage 26, to which it is fastened to be driven as a flying probe, and a mounting screw 27. The dual-contact probe tip 24 includes a first probe pin 28 and a second probe pin 30, both of which are attached within a mounting block 32, which is in turn fastened to the carriage 26 by means of the mounting screw 27. The mounting block 32 includes an upward-extending screw tab portion 36, a rearward-extending flat support portion 38, and a forward-extending cantilever portion 40, to which the probe pins 28, 30 are fastened. The screw tab portion 36 includes a mounting hole 41, through which the screw 27 extends for engagement within a threaded hole 42 of carriage 26. The cantilever portion 40 is bifurcated by a rearward-extending slot 43, forming a first cantilever portion 44, in which the first probe pin 28 is fastened, and a second cantilever portion 46, in which the second probe pin 30 is fastened.

Figure 3:
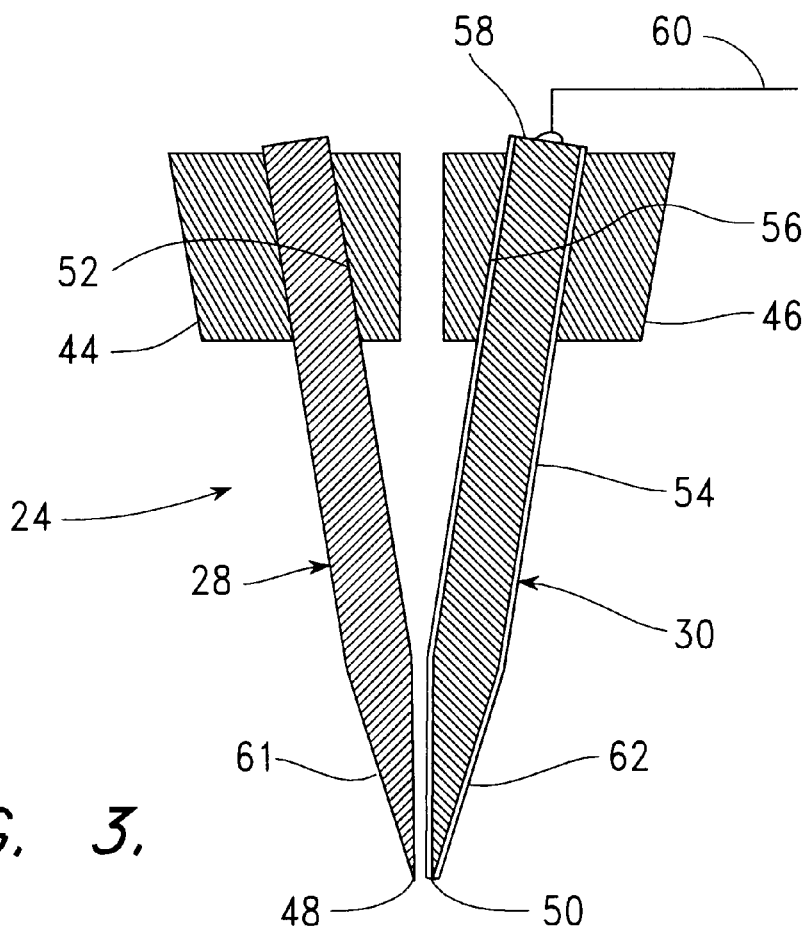
FIG. 3 is a cross-sectional elevation of the dual-contact probe tip of FIG. 2, taken as indicated by section lines III—III in FIG. 2 along a plane coincident with the axes of probe pins within the probe tip.

FIG. 3 is a cross-sectional view of the dual contact probe tip 24 of FIG. 2, taken as indicated by section lines III—III in FIG. 2 along a plane coincident with the axes of both probe pins 28, 30.

Referring to FIGS. 2 and 3, the mounting block 32 is preferably composed of a beryllium copper alloy to obtain optimal spring characteristics within the cantilever portion 40, being cut to the desired shape using a wire EDM (Electrical Discharge Machining) process. Each probe pin 28, 30 is preferably composed of tungsten carbide to maximize the number of probing cycles which can be achieved without significant wear at the corresponding probe point 48, 50 which preferably extends to a spherical radius as sharp as 0.025 mm (0.001 inch).

The first probe pin 28 is preferably soldered in place in a hole 52 within the corresponding first cantilever portion 44, establishing electrical conductivity so that the mounting block 32 becomes part of the electrical path for current flowing through this pin 28.

The second probe pin 30 is provided with a dielectric coating 54 so that it is insulated from the surface of a hole 56 in the corresponding second cantilever portion 46. This dielectric coating 54 preferably extends along the probe pin 30 so that only the probe point 50 and an end surface 58 of the probe pin 30 are outwardly exposed. In this way, the electrical conduction between the probe pins 28, 30 is prevented in case these pins are inadvertently brought together during the testing process. The dielectric coating 54 is formed, for example, using an epoxy powder supplied by the H. B. Fuller Company of Vadnais Heights, Minn. This powder may be applied as an electrostatic spray to form a coating 0.03 mm (0.0012 inch) thick. The second probe pin 30 is preferably attached within the associated hole 56 by means of an epoxy adhesive. An electrical path through probe pin 30 is formed using a wire 60 soldered to the pin end surface 58.

Each probe pin 28, 30 includes a tapered portion 61, 62, with the probe pins 28, 30 being inclined toward one another so that probe points 48, 50 are in close proximity without touching. The probe pins 28, 30 are preferably also inclined outward in the direction of arrow 63, so that a pair of opposing dual contact probe tips 24, mounted on separately movable carriages 26, may be used to place their two pairs of associated probe points 48, 50 close together for the measurement of circuits at points spaced closely to one another.

In the process of testing an electrical circuit under test (not shown), which may, for example, be a printed circuit extending along a printed circuit card, the carriage 26 is driven parallel to the plane of the circuit, in the directions of arrows 64, 65, and toward the circuit, in the direction of arrow 66, so that the probe points 48, 50 of probe pins 28, 30 contact the circuit at predetermined points. Exemplary devices providing such movement to individual probe tips, which may be replaced with dual-contact probe tips 24 built in accordance with the present invention, are described in U.S. Pat. Nos. 5,467,020, 5,543,726, and 5,631,856.

The mechanism (not shown) moving carriage 26 in the engagement direction of arrow 66 is adjusted to provide a suitable total engagement force or displacement. However, the probe pins 28, 30 must be individually compliant to allow for variations in the position of adjacent surfaces being probed. This individual compliance is provided by the bifurcation of the flexible portion of mounting block 32 into individual cantilever portions 44, 46. The deflection characteristics of the individual cantilever portions 44, 46 produce a motion rocking the probe points 48, 50 as they are brought into and out of engagement with the circuit under test (not shown). This rocking motion tends to clean the contact surfaces of the probe points 48, 50 and to break through contamination present on the surfaces of the circuit under test. Furthermore, due to the shape of the probe tips 48, 50, debris is unlikely to accumulate on these tips or the short them together.

The geometrical characteristics of the cantilever portions 44, 46, such as length, width, and thickness, may be configured to provide a particular level of individual compliance in the mounting of the probe pins 28, 30, and to provide a desired degree of contact wipe due to the rocking action. The level of individual compliance needed depends in part on the expected dimensional variation of the surface of the circuit under test.

FIG. 4 is an isometric view of a first alternative mounting block 70, which may be used in place of the mounting block 32 in the dual-contact probe tip 24. In this first alternative mounting block 70, each cantilever portion includes an outer cantilever section 72 and an inner section 74 extending adjacently along the outer section 72. The sections 72, 74 are joined by an end section 76. This configuration provides a greater degree of resilience of each probe point without significantly enlarging the size of the mounting block. Furthermore, the contact wiping action caused by the rocking motion of probe points 48, 50 (shown in FIG. 2) is increased.

Figure 5:
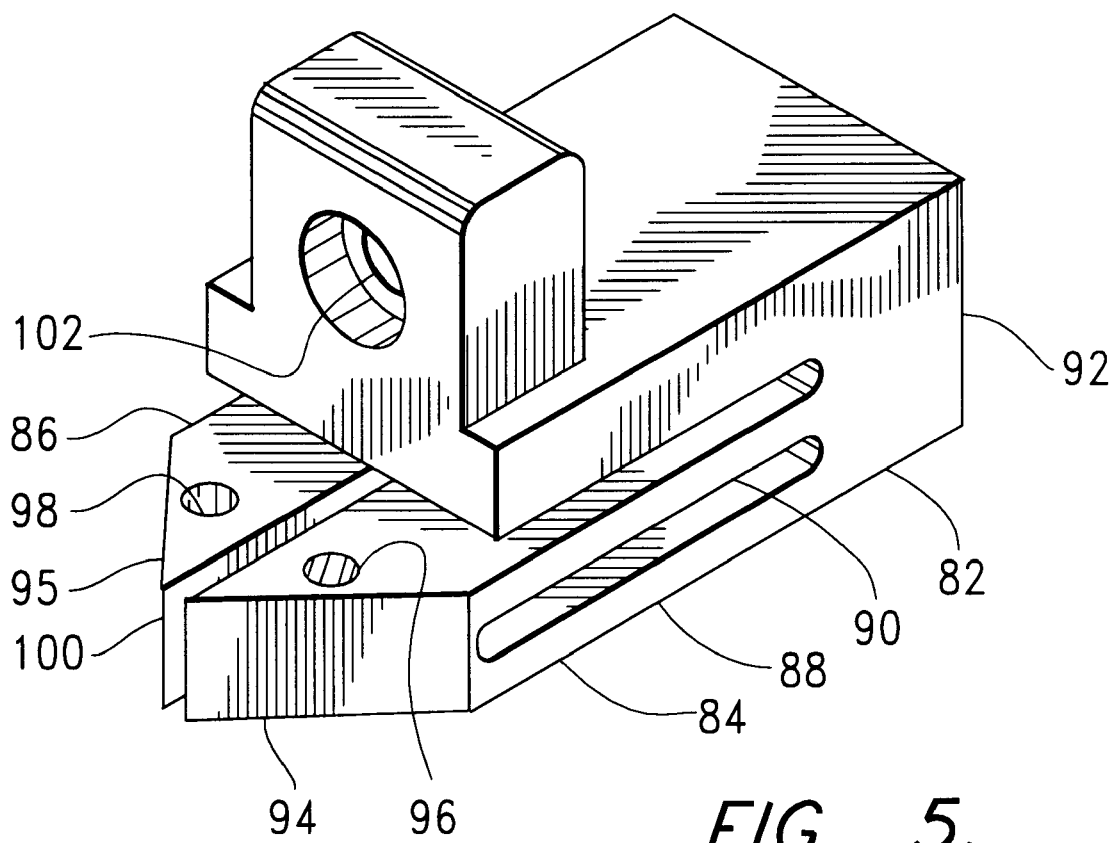
FIG. 5 is an isometric view of a second probe pin mounting block which can be used as another alternative to the probe pin mounting block of FIG. 2.

FIG. 5 is an isometric view of a second alternative mounting block 82, which may be used in place of the mounting block 32 in the dual-contact probe tip 24 (shown in FIG. 2). In this second alternative mounting block 82, each cantilever portion 84, 86 includes a pair of cantilever sections 88, 90, which are joined together both at a proximal section 92 forming a portion of an attachment section, and at a distal section 94, 95 including a hole 96, 98 for mounting a probe pin 28, 30 (shown in FIG. 2). The cantilever portions 84, 86, which are separated by a central slot 100, extend to a common proximal section 92.

Referring to FIGS. 2, 4, and 5, other features of alternative mounting block 70 are similar to those described above in reference to the mounting block 32, with a first inclined hole 96 being provided for the solder attachment of the first probe point 28, with a second inclined hole 98 being provided for the adhesive attachment of the second probe point 30, and with a mounting hole 102 being provided for attachment of the mounting block 70 or 82 to carriage 42 with mounting screw 27.

The second alternative mounting block 82 of FIG. 5 provides much less rocking motion as it is deflected. The cantilever sections 88, 90 restrain one another to be deflected into a double curve, or "S"-shape, instead of into a generally parabolic curve. Thus, with the mounting block 82, the probe pin points 48, 50, move more nearly vertically under conditions of deflection, with relatively little rocking, so that there is less scrubbing, but so that there is a smaller area on the surface of the circuit under test contacted by the probe pin points 48, 50.

While the invention has been described in its preferred form or embodiment with some degree of particularity, it is understood that this description has been given only by way of example and that numerous changes in the details of construction, fabrication and use, including the combination and arrangement of parts, may be made without departing from the spirit and scope of the invention.

What is claimed is:

1. A dual-contact probe tip for applying an input signal to a first circuit test point on a substrate surface and for measuring a resulting signal at a second circuit test point in close proximity on said substrate surface with said first circuit test point, wherein said dual-contact probe tip comprises:

an integral mounting block having an attachment section, a first flexible section extending in a first direction as a cantilever to a distal end of said first flexible section from said attachment section, and a second flexible section extending parallel to said first flexible section as a cantilever to a distal end of said second flexible section from said attachment section;

a first probe pin descending from said distal end of said first flexible section to a first probe point; at a first plane;

a second probe pin descending from said distal end of said second flexible section to a second probe point in close proximity to said first probe point at said first plane; and mounting means for attaching said attachment section to a carriage within a circuit tester.

2. The dual-contact probe tip of claim 1, additionally comprising:

a first electrically conductive path extending from said first probe point through said mounting block; and a second electrically conductive path extending from said second probe point through a wire attached to said second probe pin, with said second electrically conductive path being electrically insulated from said first electrically conductive path.

3. The dual-contact probe tip of claim 2, wherein said first probe pin is soldered within said mounting block.

4. The dual-contact probe tip of claim 2, wherein said second probe pin is coated with an electrically insulating material exposing a portion of said second probe point and a portion of said second probe pin where said wire is soldered thereto, and said second probe pin is attached to said mounting block with an electrically insulating material.

5. The dual-contact probe tip of claim 1, wherein each said probe pin includes a tapered section reduced in diameter toward said probe point thereof, and said probe pins are inclined toward one another, bringing said probe points into close proximity, as permitted by clearance between said tapered sections.

6. The dual-contact probe tip of claim 5, wherein said mounting means attaches said dual-contact probe tip to extend outwardly from said carriage in a first direction, each of said probe pins is straight, and said probe pins are additionally inclined in said first direction.

7. The dual-contact probe tip of claim 1, wherein each said flexible section extends as a plurality of partly coextensive cantilever sections connected to one another, with adjacent members of said cantilever sections extending toward said distal end in opposite directions.

8. The dual-contact probe tip of claim 1, wherein said mounting block is composed of a beryllium copper alloy, said first probe pin is composed of tungsten carbide, said second probe pin is composed of tungsten carbide having an epoxy coating exposing a portion of said second probe point and a portion of said second probe pin where a wire is soldered thereto, said first probe pin is soldered in a hole within said distal end of said first flexible section, and said second probe pin is soldered in a hole within said distal end of said second flexible section.

9. The dual-contact probe tip of claim 1, wherein said mounting block additionally includes:

a third flexible section extending to a distal end thereof from said attachment section, with said third flexible section being connected to said first flexible section at said distal ends thereof; and a fourth flexible section extending to a distal end thereof from said attachment section, with said fourth flexible section being connected to said third flexible section at said distal ends thereof.

10. A dual-contact probe tip for applying an input signal to a first circuit test point and for measuring a resulting signal at a second circuit test point in close proximity with said first circuit test point, wherein said dual-contact probe tip comprises:

an integral metallic mounting block including an attachment section, a first flexible section attached to said attachment section, including a first cantilever section extending in a first direction, a second flexible section attached to said attachment section, including a second cantilever section extending from said attachment section in said first direction in a parallel, spaced-apart relationship with said first cantilever section, with a distal end of each said cantilever section including a probe-pin attachment hole;

a first probe pin soldered in place within said probe-pin attachment hole of said first cantilever section, with said first probe pin including a pointed taper to a first probe point at a distal end thereof;

a second probe pin adhesively attached within said probe-pin attachment hole of said second cantilever section, with said second probe pin including a pointed taper to a second probe point at a distal end at a distal end thereof, and with said first and second probe pins descending from said cantilever sections at an oblique angle to one another, with said oblique angle holding said first and second probe points in close proximity to one another; and attachment means for attaching said attachment section to a carriage of a circuit tester.

11. The dual-contact probe tip of claim 10, wherein:

said mounting means attaches said dual-contact probe tip to extend outwardly from said carriage in a first direction, each of said probe pins is straight, and said probe pins are additionally inclined in said first direction.

12. The dual-contact probe tip of claim 10, wherein said apparatus additionally comprises a signal wire soldered to said second probe pin to extend therefrom;

said first and second probe pins are composed of an electrically conductive material, and said second probe pin is coated with an electrically insulating material exposing a portion of said second probe point and a portion of said second probe pin where said wire is soldered thereto.

13. The dual-contact probe tip of claim 12, wherein said electrically conductive material is tungsten carbide, and said mounting block is composed of a beryllium copper alloy.

14. The dual-contact probe tip of claim 12, wherein said electrically insulating material is an epoxy resin, and said second probe pin is attached within said mounting block by means of an epoxy adhesive.

15. The dual-contact probe tip of claim 10, wherein said first flexible section additionally includes a third cantilever section extending opposite said first direction between said attachment section and said first cantilever section, and said second flexible section additionally includes a fourth cantilever section extending opposite said first direction between said attachment section and second cantilever section in a parallel, spaced-apart relationship with said third cantilever section.

16. The dual-contact probe tip of claim 10, wherein said first flexible section additionally includes a third cantilever section extending in said first direction from said attachment section to a distal end of said third cantilever section attached to said distal end of said first cantilever section; and said second flexible section additionally includes a fourth cantilever section extending in said first direction from said attachment section to a distal end of said fourth cantilever section attached to said distal end of said second cantilever section in a parallel, spaced-apart relationship with said third cantilever section.

17. The dual-contact probe tip of claim 10, wherein said first and second probe pins are held together in close proximity as permitted by said pointed tapers at said distal ends thereof.

* * * * *